United States Patent [19]
Lin et al.

[11] Patent Number: 6,057,207
[45] Date of Patent: May 2, 2000

[54] SHALLOW TRENCH ISOLATION PROCESS USING CHEMICAL-MECHANICAL POLISH WITH SELF-ALIGNED NITRIDE MASK ON HDP-OXIDE

[75] Inventors: Chung-Te Lin, Tainan, Taiwan; Chin-Hsiun Ho, Sunnyvale, Calif.

[73] Assignee: Taiwan Semiconductor Manufacturing Company, Hsin-Chu, Taiwan

[21] Appl. No.: 09/047,542

[22] Filed: Mar. 25, 1998

[51] Int. Cl.[7] .................................................. H01L 21/76
[52] U.S. Cl. ........................... 438/424; 438/425; 438/427
[58] Field of Search .................................... 438/424, 427, 438/425, 432, 396

[56] References Cited

U.S. PATENT DOCUMENTS

| | | | |
|---|---|---|---|
| 4,090,289 | 5/1978 | Dennard et al. | 29/571 |
| 4,566,914 | 1/1986 | Hall | 148/1.5 |
| 4,954,459 | 9/1990 | Avanzino et al. | 437/228 |
| 4,962,064 | 10/1990 | Haskell et al. | 437/228 |
| 5,084,419 | 1/1992 | Sakao | 438/427 |
| 5,494,854 | 2/1996 | Jain | 437/195 |
| 5,612,242 | 3/1997 | Hsu | 437/56 |
| 5,661,060 | 8/1997 | Gill et al. | 438/400 |
| 5,817,568 | 10/1998 | Chao | 438/427 |
| 5,880,007 | 3/1999 | Varian et al. | 438/427 |
| 5,920,786 | 7/1999 | Pham et al. | 438/424 |
| 5,923,993 | 7/1999 | Sahota | 438/427 |
| 5,933,749 | 8/1999 | Lee | 438/435 |

*Primary Examiner*—John F. Niebling
*Assistant Examiner*—Walter L. Lindsay, Jr.
*Attorney, Agent, or Firm*—George O. Saile; Stephen B. Ackerman; William J. Stoffel

[57] ABSTRACT

A method of planarizing a non-conformal oxide layer 40 forming shallow trench isolation between active areas 12 in a substrate. The invention uses a first chemical-mechanical polish (CMP) step to form openings 50 only over wide active areas. An etch is used to remove oxide 40 from only over the wide active areas 12A. A second CMP step is used to planarized the oxide layer 40. The invention begins by forming spaced trenches 30 in said substrate 10 defining active areas 12. A first insulating layer 40 composed of a non-conformal silicon oxide is formed by a HDPCVD process over the substrate and fills the trenches 30. A etch barrier layer 44 is formed over the first insulating layer 40. In a first chemical-mechanical polish (CMP) step, the conformal etch barrier layer 44 over only the wide raised portions 12A is polished to form a self-aligned first openings 50. The chemical-mechanical polishing of the conformal etch barrier layer forms a self-aligned etch mask. The first insulating layer 40 is then etched through at least the first opening 50 to expose a first barrier layer 24 over the wide active areas 12A. In a second CMP step, the etch barrier layer 44 is removed and the first insulating layer 40 is planarized to fill the shallow trenches 30.

15 Claims, 3 Drawing Sheets

SHALLOW TRENCH ISOLATION PROCESS USING CHEMICAL-MECHANICAL POLISH WITH SELF-ALIGNED NITRIDE MASK ON HDP-OXIDE

BACKGROUND OF THE INVENTION

1) Field of the Invention

This invention relates generally to planarization of insulating layers over a semiconductor device and particularly to a method of etching and chemical-mechanical polishing to planarize an insulating layer over raised portions of a semiconductor device and more particularly to a planarization method using an etch and two chemical-mechanical polishing processing steps.

2) Description of the Prior Art

In the conventional construction of integrated circuit structures, shallow trenches are formed into a substrate and the surface of the substrate are covered and the trenches are filled with a deposited oxide layer. Next, a planarization process such as an etch back or chemical-mechanical polish process is used to planarize the oxide layer which leaves a planar level surface. However, current planarization processes must be improved to better planarize oxide layers so that devices can be further miniaturized. Isolation processes and planarization processes must be improved to provide more uniform planarization layers over shallow trench isolation areas. Current chemical-mechanical polish (CMP) processes still produce non-uniform insulating layers (e.g., oxide) over active areas of various dimensions between trenches.

A recent approach to planarization is the reverse tone mask as described in U.S. Pat. No. 4,954,459 (Avanzino et al.). The approach improves planarization but adds a costly masking step. Moreover, the removal of oxide over all active areas (raised portions) causes "dishing" of oxide in the trenches. Dishing is caused by the locally faster CMP polish rate in areas that have less oxide coverage.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat No. 4,962,064 (Haskell et al.) shows that a conformal oxide insulating layer 30 and chemical-mechanical polish (CMP) process that uses a Polysilicon layer 40B (FIG. 7) as etch mask. However, Haskell's process can be improved to produce better CMP planarization by improving on the positions and thickness of the oxide layer overlying the raised portions.

U.S. Pat. No. 4,954,459(Avanzino et al.) shows an etch planarization process that uses a photoresist mask in registry with high regions of the dielectric layer and an etch back process. U.S. Pat. No. 5,494,854(Jain) shows planarization process with CMP using a dielectric stack.

U.S. Pat. No. 5,612,242 (Hsu) shows a method of forming a trench isolation in a CMOS transistor. A silicon nitride layer is deposited and etched back to form spacers on the side walls of the electrodes whereby slits are left between the field oxide layer and the spacers and between adjacent spacers. Trenches are formed by etching the silicon substrate in the slits. An oxide layer is formed to refill the trenches and then etched back to remove the spacers.

However, an improved process is still needed that produces a more planar trench oxide without CMP "dishing" effects and stringent etch requirements.

SUMMARY OF THE INVENTION

It is an object of the present invention to provide a method for fabricating a planarized oxide layer filling shallow trenches in a substrate.

It is an object of the present invention to provide a method for forming a planarized high density plasma (HDP) chemical vapor deposition (CVD)-oxide layer filling shallow trenches in a substrate using a self-aligned etch mask to remove oxide over active areas in the substrate.

It is an object of the present invention to provide a method for fabricating a planarized non-conformal oxide layer filling shallow trenches in a substrate using a self-aligned etch mask that does not use an extra photo mask to form etch openings.

It is an object of the present invention to provide a method for fabricating a planarized HDP-CVD oxide layer filling shallow trenches in a substrate using a chemical-mechanical polish (CMP) process form self-aligned openings over raised portions and etching the oxide through to openings and performing a second CMP process to fully planarize the HDPCVD oxide layer.

To accomplish the above objectives, the present invention provides a method of planarizing a non-conformal oxide layer 40 forming shallow trench isolation between active areas 12 in a substrate. The invention uses a first chemical-mechanical polish (CMP) step (FIG. 4) to form openings 50 only over wide active areas 12A. An etch (FIG. 5) is used to remove oxide layer 40 from only over the wide active areas 12A. A second CMP step (FIG. 7) is used to planarized the oxide layer 40. A key feature of the invention is the non-conformal oxide layer 40 (e.g., HDPCVD oxide) that allows opening 50 to be only formed over wide active areas 12A, not all active areas. This improves the planarization and reduces damage to the edges of the active areas by "dishing" or locally faster polish rates near the smaller dimension active areas 12B.

In more detail, the invention comprises the steps of:

a) FIG. 1—forming pad oxide layer 20 over a semiconductor substrate 10;

b) forming a first barrier layer 24 over the pad oxide layer 20;

c) forming spaced trenches 30 in the semiconductor substrate 20 through the pad oxide layer 20 and the first barrier layer 24; the trenches 30 having sidewalls and a bottom; the spaced trenches 30 defining raised portions 12, the raised portions 12 comprised of at least wide raised portions 12A and narrow raised portions 12B; the raised portions 12 are active areas of the semiconductor substrate 10;

d) FIG. 1—forming a first insulating layer 40 composed of silicon oxide by a HDPCVD process over the sidewalls and the bottom of the trench 30 and filling the trench 30; the first insulating layer 40 is a non-conformal layer;

e) FIG. 2—forming a conformal etch barrier layer 44 over the first insulating layer 40; the conformal etch barrier layer 44 is preferably composed of silicon nitride having a thickness in a range of between about 300 and 500 Å;

f) FIGS. 3 and 4—chemical-mechanical polishing the conformal etch barrier layer over the raised portions forming a first opening 50 to at least expose the first insulating layer 40 over the wide raised portions 12A; the chemical-mechanical polishing of the conformal etch barrier layer forming a self-aligned etch mask;

g) FIG. 6—etching the first insulating layer 50 through at least the first opening 50;

h) FIG. 7—chemical-mechanical polishing the etch barrier layer 24 and the first insulating layer 50 to expose at least the first barrier layer; the first insulating layer filling valleys 30 between the raised portions; and i) FIGS. 7 & 8—removing the pad oxide layer 20 and the first barrier layer 24.

The present invention provides a superior planarization process which does not require extra photoresist masking steps (e.g., reverse photo mask). The invention uses a non-conformal high density plasma chemical vapor deposition (HDPCVD) oxide layer 40 to form high areas 40A that are proportion in height to the width of the under laying raised portion 12A. A etch barrier layer 44 is formed over the oxide layer 40. In an important step, the self-aligned openings (50, FIG. 4) are formed in the etch barrier layer 44 using a first CMP step to remove the etch barrier layer 44 over the wide raised portions (active areas) 12A. The invention does not use an extra photo mask step to form the first openings. The high areas 40A can be selectively etched to remove the oxide layer 40. Next, a second CMP step is used to planarize the oxide layer 44. The removal of the high areas 40A in the oxide layer 40 ensures that the second CMP process forms a planar first insulating layer 40 without oxide remaining on the first SIN barrier layer 44 in the wide areas 12A.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE
PREFERRED EMBODIMENTS

The present invention will be described in detail with reference to the accompanying drawings. The present invention provides a method of forming a planarized insulating layer over raised portions. In particular, the invention can be used to planarize shallow trench isolation (STI) formed by high density plasma chemical vapor deposition (HDPCVD) oxide. This invention is specifically designed for non-conformal insulating layers 40, such as high density plasma chemical vapor deposition (HPDCVD) oxide layers.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not be described in detail in order to not unnecessarily obscure the present invention.

It should be recognized that many publication describe the details of common techniques used in the fabrication process of integrate circuit component. See, E.g., C. Y. Chang, S. M. Sze, in *ULSI Technology*, by The McGraw-Hill Company, Inc. copyright 1997. Those techniques can be generally employed in the fabrication of the structure of the present invention. Moreover, the individual steps of such a process can be performed using commercially available integrated circuit fabrication machines. As specifically necessary to than understanding of the present invention, exemplary technical data are set forth based upon current technology. Future developments in the art may call for appropriate adjustments as would be obvious to one skilled in the art.

The invention can be summarized as shown in the table below:

TABLE

Summary of steps of the invention.
Invention

Figure 1:
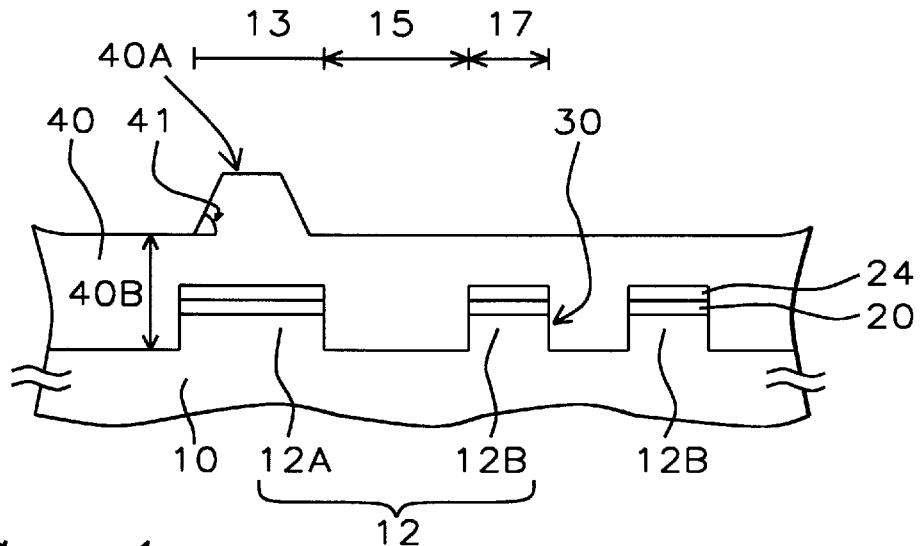
FIGS. 1 through 8 are cross sectional views for illustrating a method for planarizing a HDCVD oxide 40 filled trenches 30 between active areas 12A 12B in a substrate according to the present invention.
Figure 2:
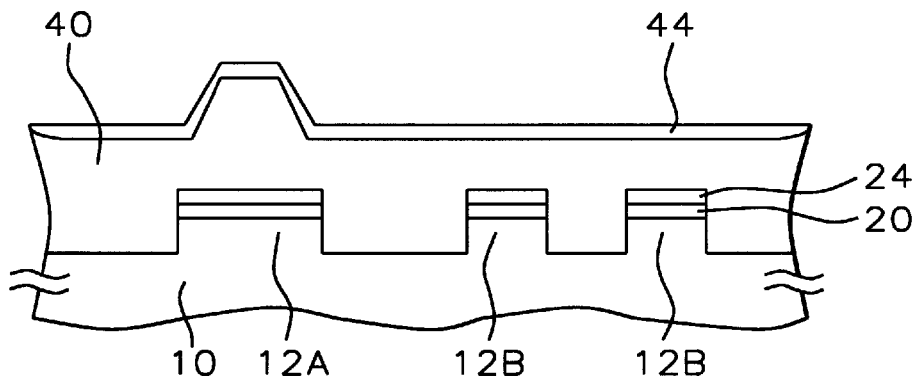
Figure 3:
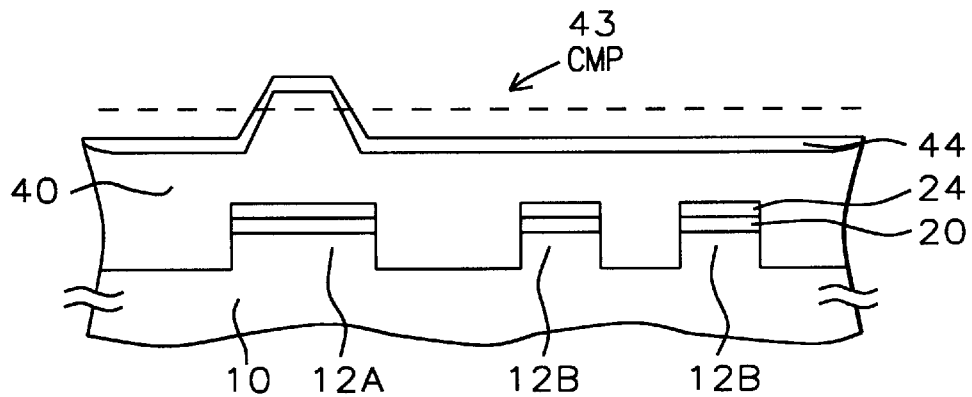
Figure 4:
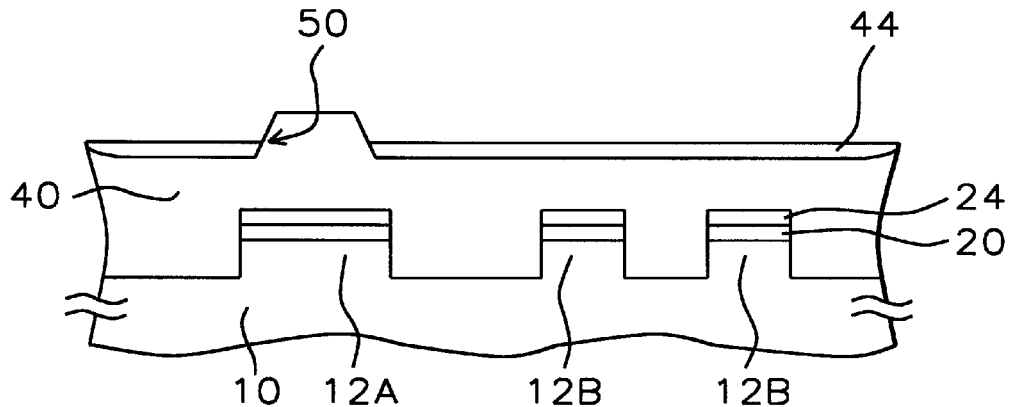
Figure 5:
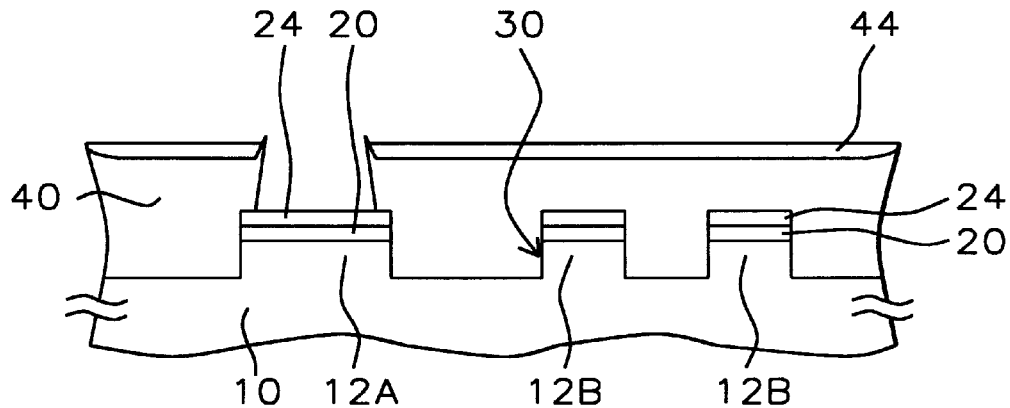
Figure 6:
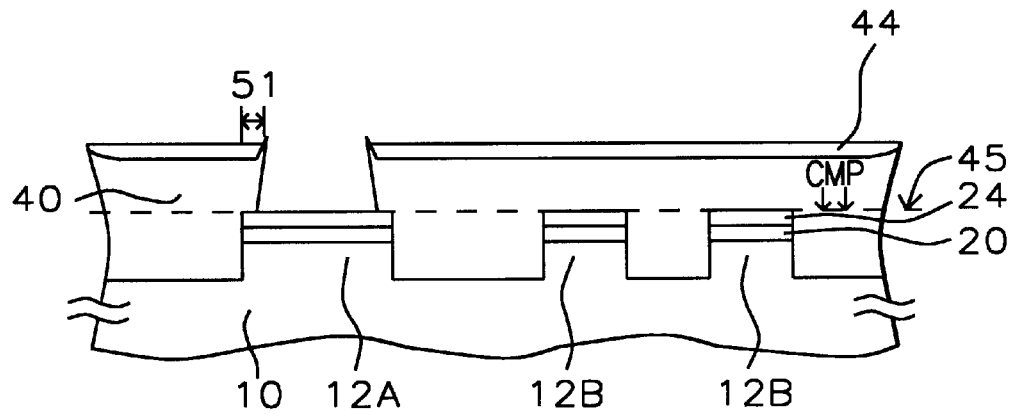
Figure 7:
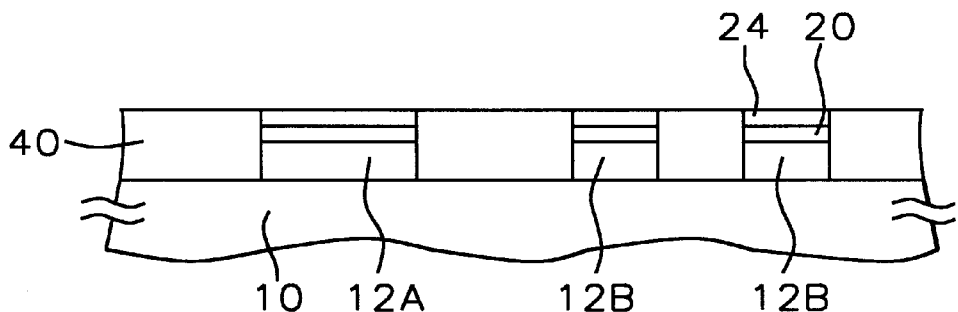
Figure 8:
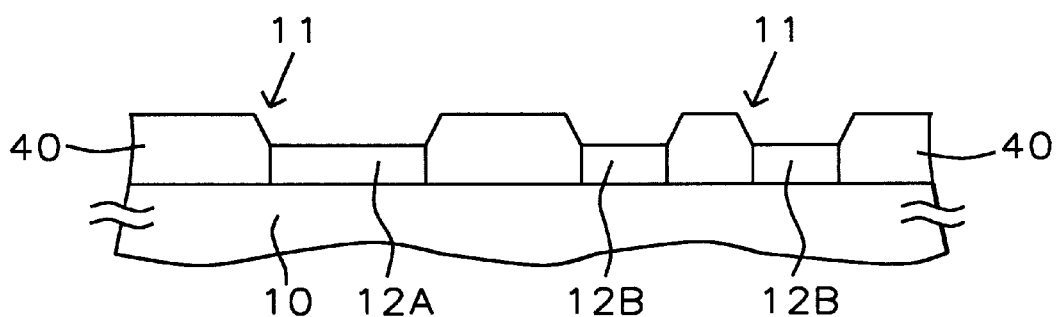

See FIG. 1 - fonn trenches 30 in substrate 10
Form HDPCVD oxide layer 40
See FIG. 2 - form SiN etch barrier layer 44 over HDPCVD oxide layer 40
See FIGS. 3 & 4 - performing a first CMP step on the SiN etch barrier layer 44 to form first openings 50
See FIG. 4 - Etch HPDCVD oxide layer 40 in first openings 50 over only wide raised portions 12A
See FIGS. 6 to 8 performing a second CMP step to planarized the HPDCVD oxide layer 40

The invention is described in detail below. A semiconductor structure 10 is provided and is understood to possibly include a semiconductor wafer, active and passive devices formed within the wafer and layers formed on the wafer surface. The term semiconductor structure is meant to include devices formed within a semiconductor wafer.

As shown in FIG. 1, a pad oxide layer 20 is formed over a semiconductor substrate 10. The pad oxide layer 20 preferably has a thickness in a range of between about 100 and 200 Å.

Still referring to FIG. 1, a first barrier layer 24 is formed over the pad oxide layer 20. The first barrier layer is composed of silicon nitride and preferably having a thickness in a range of between about 1000 and 2000 Å. The first barrier layer 24 is used as a CMP stop layer later in the process as shown in FIG. 7.

FIG. 1 shows forming spaced trenches 30 in the semiconductor substrate 20 through the pad oxide layer 20 and the first barrier layer 24. The trenches 30 have sidewalls and a bottom. The spaced trenches define active areas (AA) or raised portions. The active areas or raised portions are preferably comprised of at least wide active areas (AA) raised portions 12A and narrow AA or raised portions 12B. The raised portions 12 can represent active areas of the semiconductor substrate 10.

The trenches (or valleys) 30 preferably have a depth from the substrate surface in a range of between about 3000 and 6000 Å and more preferably about 5000 Å; and a width 15 of over 0.2 µm; and a length preferably of over about 2 µm.

The wide raised portions 12A (over which are formed the first openings 50 in the etch barrier layer 44—see FIG. 4) preferably have a width 13 of over about 0.6 µm and more preferably have a width greater than 1.2 µm and most preferably have a width over about 8 µm. The narrow raised portions 12B having a width 17 preferably under 0.6 µm.

The First Insulating Layer 40 Is A Non-Conformal Silicon Oxide Layer

Next, a first insulating layer 40, composed of a non-conformal silicon oxide, is formed over the sidewalls and the bottom of the trench 30 and filling the trench 30. The first insulating layer preferably has a thickness 40B in a range of between about 5000 and 8000 Å. The non-conformal first insulating layer is preferably formed by a high density plasma chemical vapor deposition (HPDCVD) process, but can be formed by other processes as the technology develops. The HDPCVD layer 40 has an angle 41 at the base of the high areas 40A as shown in FIG. 1. The angle 41 preferably is in the range between about 40 and 60 degrees and is more preferably about 55 degrees. The optimum angle 41 for the high points over which the openings 50 are formed is about between 48 and 52° C.

The oxide layer 50 is preferably formed using a formed by a high density plasma chemical vapor deposition (HDPCVD) process. Importantly, HDPCVD oxide layer 50 is a non-conformal oxide layer in contrast with the prior art's conformal layers, such as thermal, SACVD, and ECR oxide layers.

Prior to forming the HDPCVD layer 40, an oxide liner layer (not shown) can be formed in the trenches 30 over the substrate surfaces. The oxide liner is preferably a thermal oxide layer having a thickness in a range of between about 200 and 400 Å.

High density plasma (HDP) oxide deposition is defined as chemical vapor deposition with simultaneous dc-bias sputtering using a mixture of silicon -containing, oxygen containing and non-reactive gasses (e.g., noble gasses). High density plasma sources supply low-energy ions with densities greater than 1E12 cm$^{-2}$. In HDP oxide deposition, bias sputtering is achieved by a rf bias separately applied to the substrate to avoid charge accumulation. During deposition, the substrate is self-biased to a dc voltage that serves to accelerate Ar ions for Bias sputtering and controlling the film properties, deposition rates, etc. This method generally forms a high quality oxide with good thermal stability, low moisture uptake and fine mechanical properties. It is recognized that HDP-SiO$_2$ deposition techniques employs simultaneous deposition and dc-bias sputtering to enhance gap-filing. This is an important difference between the invention's HDPCVD oxide layer 40 and prior art CVD, SACVD, and thermal oxide layers that are conformal. Importantly, the invention's HDPCVD layer forms high spots with height proportional to the width 13 of the high spots 40A of the first insulating layer 40. The invention's HDPCVD layer allows the CMP to form openings 50 only over the wider raised portions 12A. This optimizes the etch and chemical-mechanical polish process to minimize dishing and to ensure that non oxide remains over the SIN layer 24 over the wide active area regions 12A. The invention preferably forms openings only over raised areas 40A (wide raised portions e.g., 12A) having a width 13 over 1.2 μm.

The HDPCVD process is preferably performed at the set points shown below:

TABLE

| Preferred HDPCVD process parameters for layer 40 | | | | |
|---|---|---|---|---|
| Process type, | | units | | |
| HDPCVD.. | | Low | tgt | hi |
| Thickness | Å | 5000 | 6000 | 8000 |
| Reactant gas SiH6, O$_2$ and Ar sputter | | | | |
| oxygen flow rate | sccm | 200 | 250 | 300 |

TABLE-continued

| Preferred HDPCVD process parameters for layer 40 | | | | |
|---|---|---|---|---|
| Process type, | | units | | |
| HDPCVD.. | | Low | tgt | hi |
| Reactant gasses SiH6 | sccm | 100 | 120 | 140 |
| pressure | mtorr | 9 | 11 | 13 |
| temperature | C° | 450 | 500° C. | 550 |
| RF | | 2900 | 3100 | 3300 |
| wafer temperature | C° | 280 | 300 | 320 |

U.S. Pat No. 5,494,854(Jain) describes HDPCVD oxide layer fabrication techniques/processes and is herein incorporated by reference.

It an major advantage of the invention that the invention's HDPCVD non-conformal layer 40 has high areas 40A that only form over wide portions 12A because openings 50 are only formed in these areas. See below. It is not feasible to use a conformal oxide process and have proper openings 50 form only over wide portions. This is required by the CMP process. Other oxide process will give opening 50 over wide and narrow raised portions.

It is important to note that HDPCVD oxide layer 40 is a non-conformal oxide layer (in contrast to U.S. Pat No. 4,962,064 (Haskell) which forms a conformal oxide layer). The invention's layer 40 has high areas (e.g., 40A) over areas where the underlying raised portions are wide. The HDPCVD oxide layer has a simultaneous deposition and etch process that forms high spots proportional to the width of the underlying raised portion (e.g., 12A and 12B). The invention's HDPCVD oxide layer forms exaggerated high portions 40A over wide raised portions 12A but not over narrower raised portions 12B. Intermediate width raised portions (not shown) can formed intermediate height raised oxide layer that can also have self-aligned openings depending on the depth that the chemical-mechanical polish (CMP) step (show in FIG. 4) is performed.

As shown in FIG. 2, a conformal etch barrier layer 44 is formed over the first insulating layer 40. The conformal etch barrier layer 44 is preferably composed of silicon nitride. The conformal etch barrier layer 44 preferably has a thickness in a range of between about 200 and 500 Å.

The First CMP Step Forms First Openings 50 Only Over Wide Active Areas 12A

As shown in FIG. 3, the conformal etch barrier layer 44 over the raised portions (e.g., 12A) is preferably chemical-mechanical polished (CMP) (first CMP step) forming a first opening 50 to at least expose the first insulating layer 40 over the wide raised portions 12B. In FIG. 3, the line 43 shows the level the oxide 40 is polished down. The CMP process can be performed to different depths to remove the etch barrier layer 44 over raised portions of varying widths, not only the widest width raised portions 12A.

It is an important feature of the invention that the chemical-mechanical polishing of the conformal etch barrier layer forms a self-aligned etch mask. In prior processes (e.g., U.S. Pat No. 4,954,459) Avanzino), a reverse tone photoresist mask was used to produce openings in an etch mask. However, the chemical-mechanical polish (CMP) process of the invention is less complicated, less expensive and more accurate than the reverse tone processes. Moreover, the invention does form etch openings 50 over all the raised portions 12, but selectively over the wide raised portions 12A. Also, the invention uses the depth of the 1st CMP step to selectively control which width ranges of raise portion the etch openings 50 are formed over.

As shown in FIG. 6, the first insulating layer 50 is etched through at least the first opening 50. The etching of the first insulating layer 50 preferably is a wet etch using DHF or BOE or comprising a dry etch. Most preferably the first insulating layer 50 is etch using a dry etch.

The width openings 50 are smaller that the raise portion 12A by a width 51 as shown in FIG. 6. A depth of oxide layer 40 is etched away between about 2000 and 4000 Å. The SiN layer 24 is always exposed by the etch because the SiN layer 24 is used as an etch stop layer. The dotted liens 45 shows the level the oxide layer 40 is polished with the second chemical-mechanical polish (CMP) step.

It a major advantage of the invention that the invention's HDPCVD layer 40 has high areas 40A that are in roughly proportion to the width of the wide raised portions 12A because the high areas 40A are used to make a self aligned SiN etch mask 44. This creates openings 50 only over wide active areas 12A. Preferably, this creates openings 50 only over wide active areas 12A. that are of a minimum width 13 of greater than about 1.2 $\mu$m. In contrast, U.S. Pat. No. 4,962,064, Haskell's thermal oxide layer 30 is conformal and the openings are formed over all Active areas. The invention only forms high spots 40a and openings 50 over Active Areas 12A that are of a minimum width. This yields a more controllable process.

The inventor has found problems using processes, such as reverse tone masks that remove the oxide 40 from over all active areas 12A and 12B because of the locally faster CMP polish rate near the small dimension active areas 12B that thins the oxide 40 on the edges of the trench and can damage (polish) the substrate. U.S. Pat. No. 4,962,064 (Haskell) and U.S. Pat. No. 4,954,459(Avanzino) can suffer from this damage problem. In contrast, the invention prevents this problem by forming the insulating layer 40 by HDPCVD and only etching the oxide 40 from over the wide active areas 12A. FIG. 8 shows the top edges 11 of the active areas 12A and 12B are not polished by the second CMP step. In prior art processes, the active areas are damaged by the locally enhanced polish rate.

As shown in FIG. 7 the etch barrier layer 44 and the first insulating layer 50 are chemical-mechanical polished a second time to expose at least the first barrier layer 24. The first insulating layer fills valleys 30 between the raised portions 12A 12B.

The first barrier layer 24 is used as a CMP stop layer as shown in FIG. 7.

Referring to FIG. 8, the pad oxide layer 20 and the first barrier layer 24 then removed. The pad oxide and SiN layer 24 are removed with an etch preferably of $H_3PO_4$ (for the SiN) and a DHF or BOE etch for the pad oxide.

FIG. 8 shows the final planarized first insulating layer 40. It is important to note that the oxide layer 40 remains near the edge of the Active areas 12A, 12B and that the active areas 12A 12B were not damaged by the Second chemical-mechanical polish step. FIG. 8 shows that the top surface of the first insulating layer 40 is higher than the top surface of the active areas 12A 12B by a height preferably in a range of between about 300 and 700 Å. This prevents the active areas (AA) 12A, 12B, and more particularly the small dimension AA 12B from being polished and thereby damaged by the second CMP step.

The process of the invention provides an effective, easy to manufacture planarization process. Alternate planarization process use expensive reverse tone masks and sophisticated CMP processes to planarized insulating layers. The invention proves a self-aligned etch mask 44 to remove the high portions 40A of the insulating layer over the underlying high points.

The present invention provides a superior planarization process which does not require extra photoresist masking steps (e.g., reverse photo mask). The invention uses non-conformal high density plasma chemical vapor deposition (HDPCVD) oxide layer 40 to form high areas 40A that are proportion in height to the width of the under laying raised portion 12A. A etch barrier layer 44 is formed over the oxide layer 40. In an important step, the self-aligned openings are formed in the etch barrier layer using a CMP process to remove the etch barrier layer over the high areas 40A. The invention does not use an extra photo mask step to form the first openings. The high areas 40A can be selectively etched to remove the oxide layer 40. Next, a second CMP step is used to planarize the oxide layer 44. The removal of the high areas 40A in the oxide layer 40 ensures that the second CMP process forms a planar layer oxide remaining over the wide portions 12a.

The invention's HDP-SiO$_2$ deposition technique for non-conformal layer 40 employs simultaneous deposition and dc-bias sputtering to enhance gap-filing. This is an important difference between the invention HDPCVD oxide layer 40 and prior art CVD and thermal oxide layers that are conformal. Importantly, the invention's HDPCVD layer forms high spots with height proportional to the width of the wide active areas 12A. The invention's HDPCVD layer allows the CMP (FIG. 3) to form openings 50 only over the wider raised portions 12A. This optimizes the etch and chemical-mechanical polish process to minimize dishing.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a planarized first insulating layer over a semiconductor structure; comprising the steps of:

a) providing a semiconductor structure having spaced raised portions and trenches therebetween; said raised portions comprised of at least wide raised portions and narrow raised portions;

b) forming a first insulating layer composed over said semiconductor structure; said first insulating layer is a non-conformal layer;

c) forming an etch barrier layer over said first insulating layer;

d) chemical-mechanical polishing said etch barrier layer over said raised portions forming a first opening in said etch barrier layer to expose said first insulating layer over said wide raised portions;

e) etching said first insulating layer through said first opening; and f) chemical-mechanical polishing said etch barrier layer and said first insulating layer, said first insulating layer filling said trenches between said raised portions.

2. The method of claim 1 wherein said raised portions have a height in a range of between about 3000 Å and 5000 Å; said wide raised portions have a width greater than about 0.6 $\mu$m; and said narrow raised portions having a width less than 0.6 $\mu$m.

3. The method of claim 1 wherein said first insulating layer is composed of silicon oxide formed by a HDPCVD process.

4. The method of claim 1 wherein said first insulating layer has a thickness in a range of between about 5000 and 8000 Å.

5. The method of claim 1 wherein said etch barrier layer is composed of silicon nitride having a thickness in a range of between about 200 and 500 Å.

6. The method of claim 1 wherein said first opening only formed over wide raised portions having a width greater than 1.2 µm.

7. A method of fabricating a HDPCVD oxide filled shallow trench isolation comprising the steps of:
   a) forming pad oxide layer over a semiconductor substrate;
   b) forming a first barrier layer over said pad oxide layer;
   c) forming spaced trenches in said semiconductor substrate through said pad oxide layer and said first barrier layer; said trenches having sidewalls and a bottom; said spaced trenches defining raised portions, said raised portions comprised of at least wide raised portions and narrow raised portions; said raised portion are active areas of said semiconductor substrate;
   d) forming a first insulating layer composed of a non-conformal silicon oxide formed by a high density plasma chemical vapor deposition (HDPCVD) process over said sidewalls and said bottom of said trench and filling said trench;
   e) forming an etch barrier layer over said first insulating layer; said etch barrier layer is comprised of silicon nitride;
   f) chemical-mechanical polishing said etch barrier layer over said wide raised portions forming a first opening to at least expose said first insulating layer over said wide raised portions;
   g) etching said first insulating layer through said first opening exposing portions of said first barrier layer;
   h) chemical-mechanical polishing said etch barrier layer and said first insulating layer to expose at least said first barrier layer; said first insulating layer filling said trenches between said raised portions; and
   i) removing said pad oxide layer and said first barrier layer.

8. The method of claim 7 wherein said first barrier layer has a thickness in a range of between about 1000 and 2000 Å.

9. The method of claim 7 wherein said wide raised portions having a width greater than about 0.6 µm.

10. The method of claim 7 wherein said wide raised portions having a width greater than about 1.2 µm.

11. The method of claim 7 wherein said trenches having a depth in a range of between about 3000 and 6000 Å and a width greater than about 0.2 µm.

12. The method of claim 7 wherein said first insulating layer having a thickness in a range of between about 5000 and 8000 Å.

13. The method of claim 7 wherein said etch barrier is composed of silicon nitride having a thickness in a range of between about 200 and 500 Å.

14. The method of claim 7 wherein after step (i) the top surface of said first insulating layer is higher than the top surface of said raised portions by a height in a range of between about 300 and 700 Å.

15. A method of fabricating a HDPCVD oxide filled shallow trench isolation comprising the steps of:
   a) forming pad oxide layer over a semiconductor substrate;
   b) forming a first barrier layer over said pad oxide layer; said first barrier layer composed of silicon nitride and having a thickness in a range of between about 1000 and 2000 Å;
   c) forming spaced trenches in said semiconductor substrate through said pad oxide layer and said first barrier layer; said trenches having sidewalls and a bottom; said spaced trenches defining raised portions, said raised portions comprised of at least wide raised portions and narrow raised portions; said raised portion are active areas of said semiconductor substrate; said wide raised portions have a width greater than 1.2 µm;
      (c 1) said trenches having a depth in a range of between about 3000 and 6000 Å and a width greater than about 0.2 µm;
   d) forming a first insulating layer composed of a non-conformal silicon oxide formed by a HDPCVD process over said sidewalls and said bottom of said trench and filling said trench;
      (d 1) said first insulating layer having a thickness in a range of between about 5000 and 8000 Å;
   e) forming a etch barrier layer over said first insulating layer; sad etch barrier layer composed of silicon nitride having a thickness in a range of between about 200 and 500 Å,
   f) chemical-mechanical polishing said conformal etch barrier layer over said raised portions forming a first opening to at least expose said first insulating layer over said wide raised portions;
   g) etching said first insulating layer through at least said first opening; exposing portions of said first barrier layer;
   h) chemical-mechanical polishing said etch barrier layer and said first insulating layer to expose at least said first barrier layer; said first insulating layer filling said trenches between said raised portions;
   i) removing said pad oxide layer and said first barrier layer using an etch process; the top surface of said first insulating layer is higher than the top surface of said raised portions by a height in a range of between about 300 and 700 Å.

* * * * *

UNITED STATES PATENT AND TRADEMARK OFFICE
CERTIFICATE OF CORRECTION

PATENT NO. : 6,057,207
DATED : May 2, 2000
INVENTOR(S) : Chung-Te Lin, Chin-Hsiung Ho It is certified that error appears in the above-identified patent and that said Letters Patent is hereby corrected as shown below:

On the Title page, in Item (75), delete "Chin-Hsiun Ho", and replace with -- Chin-Hsiung Ho --.

Signed and Sealed this

Twenty-second Day of May, 2001

*Attest:*

NICHOLAS P. GODICI

*Attesting Officer*     *Acting Director of the United States Patent and Trademark Office*